United States Patent
Lim (12)
(10) Patent No.: US 6,225,164 B1
(45) Date of Patent: May 1, 2001

(54) SEMICONDUCTOR MEMORY AND METHOD FOR FABRICATING THE SAME

(75) Inventor: Min Gyu Lim, Chungcheongbuk-do (KR)

(73) Assignee: Hyundai Electronics Industries Co., Ltd., Icon-shi (KR)

( * ) Notice: Subject to any disclaimer, the term of this patent is extended or adjusted under 35 U.S.C. 154(b) by 0 days.

(21) Appl. No.: 09/642,592

(22) Filed: Aug. 22, 2000

(30) Foreign Application Priority Data

Nov. 3, 1999 (KR) .................................................. 99-48446

(51) Int. Cl.⁷ ................................................ H01L 21/8247
(52) U.S. Cl. ............................................. 438/264; 438/594
(58) Field of Search ..................................... 438/257–267, 438/593–594

(56) References Cited

U.S. PATENT DOCUMENTS

| 5,756,385 | * | 5/1998 | Yuan et al. ............................ | 438/258 |
| 5,830,771 | * | 11/1998 | Fukatsu et al. . | |
| 5,846,861 | * | 12/1998 | Saitoh ................................. | 438/258 |
| 6,051,451 | * | 4/2000 | He et al. .............................. | 438/142 |
| 6,140,185 | * | 10/2000 | Kimura ................................ | 438/275 |

OTHER PUBLICATIONS

H. Kume et al.; "A Flash–Erase EEPROM Cell with an Asymmetric Source and Drain Structure;" 1987 IEEE, IEDM 87, pp. 560–563.

* cited by examiner

Primary Examiner—Richard Booth
(74) Attorney, Agent, or Firm—Fleshner & Kim, LLP (57) ABSTRACT

Semiconductor memory and a method for fabricating the same, in which sides of a floating gate is formed to have a streamlined profile, for improving a device performance, the semiconductor memory including a semiconductor substrate, a plurality of field oxide films formed at fixed intervals in one direction for isolating an active region between adjacent field oxide films, a plurality of control gates formed at fixed intervals in a second direction perpendicular to the field oxide films, a plurality of floating gates respectively formed under the control gates spaced a distance from each other each having edge portions in the second direction with moderate slopes, an interlayer insulating layer formed at interfaces between the floating gate and the control gate, and source/drain formed in surfaces of a semiconductor substrate on both sides of the control gate.

10 Claims, 8 Drawing Sheets

(a) section across line B₁-B₁'

(b) section across line B₁-B₁'

(c) section across line B₁-B₁'

SEMICONDUCTOR MEMORY AND METHOD FOR FABRICATING THE SAME

BACKGROUND OF THE INVENTION

1. Field of the Invention

The present invention relates to a stack gate flash memory, and more particularly, to a semiconductor memory and a method for fabricating the same, in which sides of a floating gate is formed to have a streamlined profile, for improving a device performance.

2. Background of the Related Art

Figure 1:
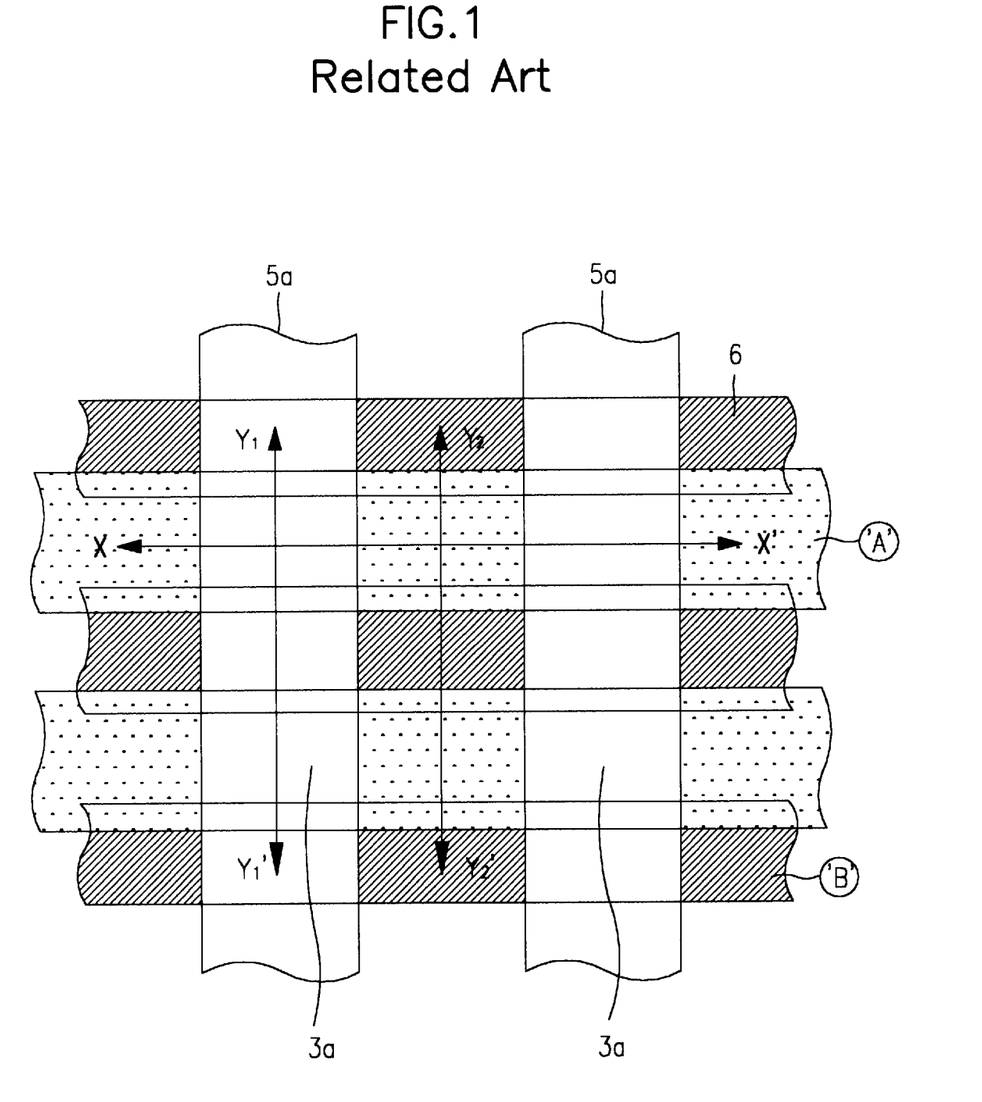
FIG. 1 illustrates a layout of a related art flash memory cell.

In general, a stack gate flash memory is a nonvolatile memory having a stack of a floating gate for storage of electrons and a control gate for providing a bias in data storage and forwarding. A related art stack gate flash memory will be explained with reference to the attached drawings. FIG. 1 illustrates a layout of a related art flash memory cell, and FIGS. 2A~2E illustrate sections across lines X–X', Y1–Y1', and Y2–Y2' in FIG. 1 showing the steps of a method for fabricating a flash memory cell.

In the related art method for fabricating a stack gate flash memory cell, after an etch profile of the floating gate is formed in a vertical direction, a polysilicon layer for forming an ONO layer and a control gate is formed. In a plan view as shown in FIG. 1, the floating gate 3b and the control gate 5a are formed to cross each other (before patterning the floating gate for the second time). The floating gate 3b is patterned in a direction the same with a field oxide film 6 for the first time, and etched self-aligned with the control gate again after the control gate 5a is patterned, thereby being floated electrically. The 'A' in FIG. 1 denotes a part removed in the second patterning for forming the floating gate, and the 'B' denotes a part of the field oxide film damaged when the field oxide film is overetched for removal of an ONO stringer remained in a vertical direction at sides of a patterned layer after the first patterning for forming the floating gate.

A related art method for fabricating a stack gate flash memory will be explained. FIGS. 2A~2E illustrate sections showing the steps of a related art method for fabricating a stack gate flash memory, wherein positions of the sections are determined such that the sections show the best features of the steps.

Figure 2:
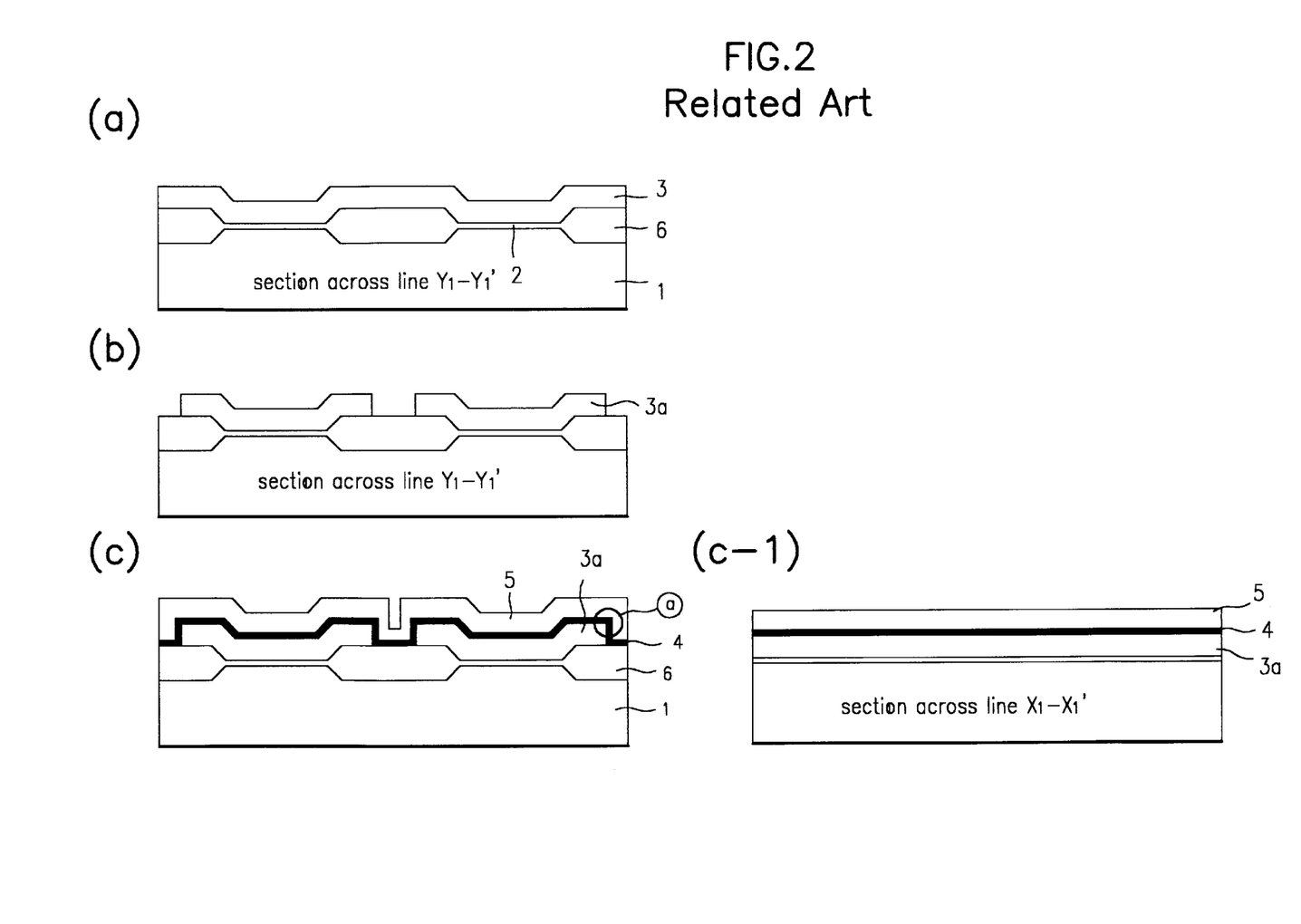
FIGS. 2A~2E illustrate sections across lines X–X', Y1–Y1', and Y2–Y2' in FIG. 1 showing the steps of a method for fabricating a flash memory cell.

Referring to FIG. 2A, a field oxide film 6 is formed on a device isolation region of a semiconductor substrate, and a tunneling oxide film 2 is formed on an active region of the semiconductor substrate 1. A material layer for forming a floating gate, such as polysilicon layer, is formed on an entire surface having the tunneling oxide film 2 formed thereon. Then, as shown in FIG. 2B, photolithography is used in a first patterning, to form a polysilicon pattern layer 3a for forming a floating gate. As shown in FIGS. 2C and 2C-1, an ONO (Oxide-Nitride-Oxide) layer 4 as an interlayer insulating film, and a material layer for forming a control gate, such as a polysilicon layer 5, are formed on an entire surface having the polysilicon pattern layer 3a formed thereon. In this instance, an X–X' section shows a state in which the tunneling oxide film 2, the polysilicon pattern layer 3a, the ONO layer 4, and the polysilicon layer 5 are formed on the semiconductor substrate 1 stacked in succession. Then, as shown in FIG. 2D, the polysilicon layer 5 for forming the control gate is etched selectively, to form the control gate 5a, and the control gate 5a is used as a mask in etching the ONO layer 4, and the polysilicon pattern layer 3a selectively, to stack the control gate 5a, the ONO layer 4, and the floating gate 3a in succession. In this instance, the etching of the polysilicon pattern layer 3a using the control gate 5a as a mask is conducted as shown in FIGS. 2D-1, 2D-2, and 2D-3. That is, an overetch is conducted to remove remained vertical stringers 4a of the ONO layer at sides of the polysilicon pattern layer 3a in a Y2–Y2' section, though there are no such vertical stringers in an X–X1' section. The overetch gives damage to the field oxide film 6('C' part). Then, as shown in FIG. 2E, impurity ions are implanted in surfaces of the substrate on both sides of the control gate 5a and the gate sidewalls 7 using the control gate 5a and the gate sidewalls 7 as masks, to form source/drain regions 8. The flash memory cell formed according to this process is a nonvolatile memory operative in write/erase/read. In writing, high voltages are provided to the control gate 5a and a drain, for injecting hot electrons generated in the vicinity of the drain to the floating gate 3b. The electrons injected in the floating gate 3b boosts a threshold voltage of the control gate, to form a state which is different from a low threshold voltage state. The electrons injected in the floating gate 3b stay in the floating gate 3b even if there is no external power supply, to maintain a programmed state. In erasing, a high voltage is provided to a source junction, so that the electrons in the floating gate 3b escape to the source junction through the tunneling oxide film 2. The escape of the electrons form the floating gate 3b drops the threshold voltage of the control gate 5a. In reading, a voltage in the middle of the threshold voltage in the erase state and the threshold voltage in the programming state is provided to the control gate 5a, and the channel is determined of being conductive. In the programmed state, the channel is not conductive as the threshold voltage is lower than a voltage provided to the control gate 5a, and, in the erase state, the channel is conductive as the threshold voltage is lower than a control gate 5a voltage.

However, the related art stack gate flash memory has the following problems.

First, the vertical sides of the floating gate ('a' part in FIG. 2C) cause difficulty in removing vertical ONO layers remained at sides of the floating gate. The ONO layer (at sides of the floating gate) for use as an interlayer insulating layer remained even after the polysilicon for use as the floating gate is etched makes following processes difficult, and is a cause of defect as the ONO layer falls off during the following processes. The overetch carried out in an intention to remove the remained ONO layer which causes the defect completely causes damage to the field oxide film as an etch selectivity of the ONO layer over the field oxide film is not so high. When the floating gate has a thickness in a range of 1500 Å, as the ONO layer also has a thickness in the range of 1500 Å, a loss of the field oxide film is in the range. Such as loss of field oxide film deteriorates a device isolation characteristics, and causes difficulty in processing the fabrication coming form formation of steps. And, the damage to the active region coming from the overetch affects to a device reliability.

Second, the leakage of electrons from sharp edges of the floating gate when a high voltage is provided to the control gate in a programming operation deteriorates a data retention characteristics.

Third, though a program efficiency can be the better as an area of the floating gate overlapped with the control gate on the field oxide film the larger owing to an increased coupling ratio, a distance between the floating gates is dependent on a minimum patterning dimension in a photolithography as the first time etching of the floating gate is carried out by the photolithography. There is a limitation in increasing an area of the floating gate in the same area.

SUMMARY OF THE INVENTION

Accordingly, the present invention is directed to a semiconductor memory and a method for fabricating the same that substantially obviates one or more of the problems due to limitations and disadvantages of the related art.

An object of the present invention is to provide a semiconductor memory and a method for fabricating the same, which can improve a device performance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor memory includes a semiconductor substrate, a plurality of field oxide films formed at fixed intervals in one direction for isolating an active region between adjacent field oxide films, a plurality of control gates formed at fixed intervals in a second direction perpendicular to the field oxide films, a plurality of floating gates respectively formed under the control gates spaced a distance from each other each having edge portions in the second direction with moderate slopes, an interlayer insulating layer formed at interfaces between the floating gate and the control gate, and source/drain formed in surfaces of a semiconductor substrate on both sides of the control gate.

In other aspect of the present invention, there is provided a method for fabricating a semiconductor memory, including the steps of (1) forming a field oxide film on a semiconductor substrate in one direction, (2) depositing a material for forming floating gate on an entire surface, and forming and stacking a first and a second masking material layers, (3) selectively patterning the first and second masking material layers, and forming masking sidewalls at sides thereof, (4) using the first and second masking material layers and the masking sidewalls in conducting an isotropic etching for first time patterning of the material layer for forming a floating gate, to form a separation region in the first direction on the field oxide film, (5) forming an interlayer insulating layer, and a control gate forming material layer on an entire surface in succession, (6) selectively patterning the control gate forming material layer to form a control gate separated in a second direction, (7) using the control gate in patterning the floating gate forming material layer for the second time, and processing impurity implanting for forming source/drain.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 3:
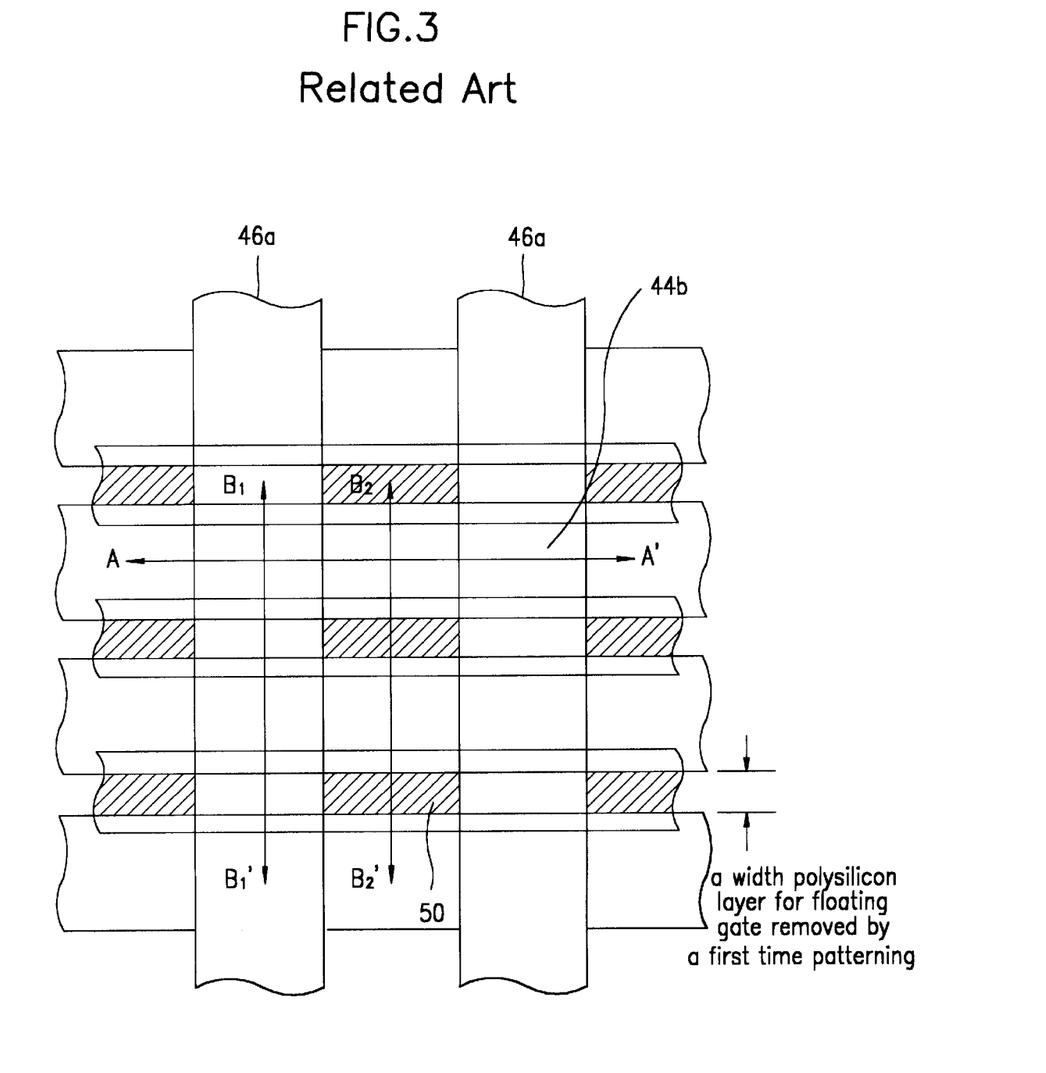
FIG. 3 illustrates a layout of a flash memory cell in accordance with a preferred embodiment of the present invention; and, FIGS. 4A~4G illustrate sections across lines A–A', B1–B1', and B2–B2' in FIG. 3 showing the steps of a method for fabricating a flash memory cell in accordance with a preferred embodiment of the present invention.

Reference will now be made in detail to the preferred embodiments of the present invention, examples of which are illustrated in the accompanying drawings. FIG. 3 illustrates a layout of a flash memory cell in accordance with a preferred embodiment of the present invention, and FIGS. 4A~4G illustrate sections across lines A–A', B1–B1', and B2–B2' in FIG. 3 showing the steps of a method for fabricating a flash memory cell in accordance with a preferred embodiment of the present invention. The semiconductor memory and the method for fabricating the same of the present invention suggests to form a floating gate in a first patterning process that has no vertical sides, for dispensing with the overetch and providing a distance between floating gates to be below a minimum patterning dimension in a photolithography.

Referring to FIG. 3, it can be known that a distance between polysilicon layers formed to form floating gates is reduced. The first patterning of the floating gate in fabrication of the stack gate flash memory cell of the present invention is carried out, not by the photolithography, but etch back, to form the side profiles to have moderate slopes, after which a polysilicon layer is formed for forming an ONO layer and the control gate. In the plan view, the floating gate 44b and the control gate 46a are perpendicular to each other (before the second time patterning of the floating gate). The floating gate 44b is patterned in the same direction with the field oxide film 43 for the first time, and etched self aligned with the control gate 46a again after the control gate 46a is patterned, thereby being electrically floated. The reference numeral 50 in FIG. 30 represents a region on which an ONO layer stringer 49 may be remained with a moderate slope at sides of patterned layer after the first time patterning for forming the floating gate. As the ONO layer stringer 49 is removed without overetch, there is no damage to the field oxide film in this region, substantially.

A structure of a semiconductor memory of the present invention will be explained.

The semiconductor memory of the present invention includes a plurality of field oxide films 43 formed at fixed intervals in one direction for isolating an active region between adjacent field oxide films 43, a tunneling oxide film 42 formed on a surface of the active region defined by the adjacent field oxide films 3, a plurality of control gates 46a formed at fixed intervals in a second direction perpendicular to the field oxide films 43, a plurality of floating gates 44b respectively formed under the control gates 46a spaced a distance from each other below a minimum patterning dimension of photolithography each having edge portions in the second direction with moderate slopes, an ONO layer 45 formed at an interface between the floating gate 44b and the control gate 46a, gate sidewalls 47 formed at sides of the control gate 46a and the floating gate 44b, and source/drain 48 formed in surfaces of a semiconductor substrate 41 on both sides of the control gate 46a.

A method for fabricating the aforementioned flash memory cell in accordance with a preferred embodiment of the present invention will be explained.

Figure 4:
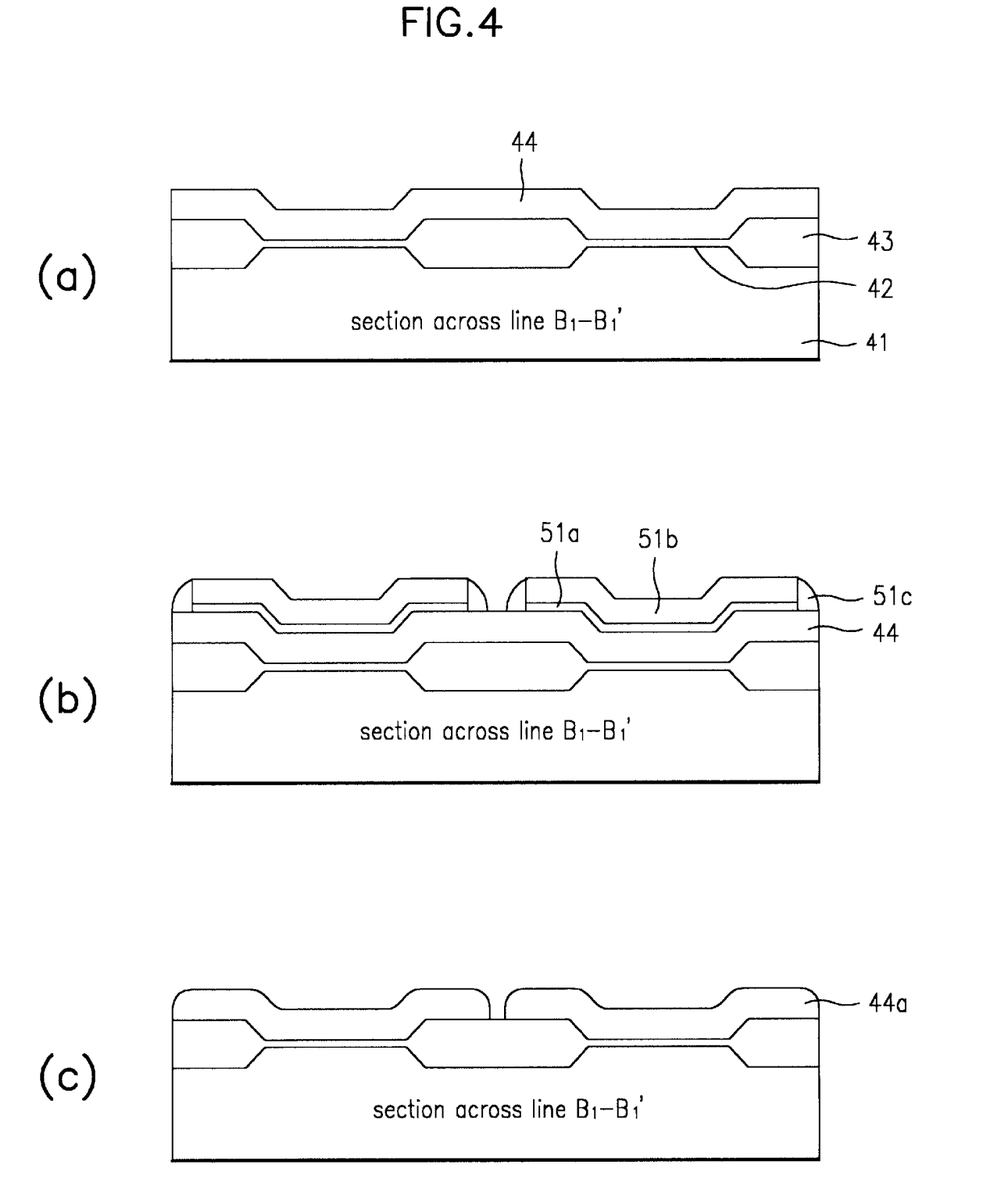

Referring to FIG. 4A, a field oxide film 43 is formed on a device isolation region of a semiconductor substrate 41, and a tunneling oxide film 42 is formed on an active region of the semiconductor substrate 41. A material layer for forming a floating gate, such as a polysilicon layer 44, is formed on an entire surface having the tunneling oxide film formed thereon. As shown in FIG. 4B, a masking oxide film 51a is formed on an entire surface of the polysilicon layer 44 by an HLD (High Temperature Low Pressure Deposition). And, a masking polysilicon layer 51b is formed on the masking oxide film 51a to a thickness identical to an underlying polysilicon layer 44 for floating gate. The masking polysilicon layer 51b is selectively etched, and an exposed portion of the masking oxide film 51a is removed, too. A polysilicon layer is formed on an entire surface again, and etched back by anisotropic dry etching, to form masking polysilicon sidewalls 51c at sides of the patterned masking polysilicon layer 51b. As shown in FIG. 4C, the masking polysilicon layer 51b, and the masking polysilicon sidewalls 51c are etched back by anisotropic dry etching, until the masking oxide film 51a is exposed. The etching also patterns an underlying polysilicon layer 44 for floating gate for the first time, to form a polysilicon pattern layer 44a. A distance between the polysilicon pattern layers 44a spaced by the first patterning is smaller than a distance between initially patterned masking polysilicon layer 51b, and edge portions of the polysilicon pattern layer 44a have moderate slopes. And, as shown in FIGS. 4D-1 and 4D-2, an ONO layer 45 as an interlayer insulating film, and a material layer for forming a control gate, such as a polysilicon layer 46, are formed on an entire surface having the polysilicon pattern layer 44a formed thereon. In this instance, a section across line A–A' shows the tunneling oxide film 42, the polysilicon pattern layer 44a, the ONO layer 45, and the polysilicon layer 46 stacked on the semiconductor substrate 41 in succession. As shown in FIGS. 4E-1 and 4E-2, the polysilicon layer 46 for forming control gate is selectively etched, to form the control gate 46a, and exposed portions of the ONO layer 45 are removed. In this instance, since ONO layer stringers 49 at edge portions of the polysilicon pattern layer 44a for floating gate patterned for the first time have, not rectangular profiles, but moderately sloped profiles, no overetch is conducted for removing the ONO layer stringers 49. Then, as shown in FIGS. 4F-1 and 4F-2, the control gate 46a is used as a mask in selectively etching the polysilicon pattern layer 44a, so that the control gate 46a, the ONO layer 45, and the floating gate 44b are stacked in succession. Because the etching of the polysilicon pattern layer 44a using the control gate 5a as a mask completely floats the floating gate, the polysilicon pattern layer 44a is completely removed from a section across a line B2–B2'. As shown in FIG. 4G, gate sidewalls 47 are formed at sides of the control gate 46a and the floating gate 44b for insulating gates, and impurity ions are implanted in exposed surfaces of the semiconductor substrate 41, to form source/drain regions 48 on both sides thereof. Because the method for fabricating a semiconductor memory of the present invention facilitates to form the floating gate 44b of which side profiles have moderate slopes, following fabrication processes become easy, and concentration of electric field on edge portions of the floating gate during device operation is prevented.

Other than the methods suggested in the present invention, a method may be taken into consideration in which polysilicon sidewalls are formed at sides of the floating gate directly as a method for preventing the loss of the field oxide film caused by the ONO stringers. However, since the first time patterning of the floating gate is carried out, not only on the field oxide film, but also on the active region, the active region may suffer from two times of damages over the etching of the polysilicon for floating gate and formation of the polysilicon sidewalls. And, the method may also be involved in breakage of the thin tunneling oxide film, failing to serve as a mask for the active region in the dry etching for patterning the floating gate, and in deep cut of a surface of the substrate in the polysilicon sidewall formation process. Other than this, the method may also be involved in deterioration of a device performance caused by parasitic capacitance due to natural oxide films formed at interfaces between the polysilicon layer and the polysilicon sidewalls of the floating gate.

The method suggested in the present invention can prevent the loss of the field oxide film caused by the ONO stringers without causing the foregoing problems, effectively.

As has been explained, the semiconductor memory and method for fabricating the same have the following advantages.

First, the moderate sloped floating gate, with less residual ONO stringers which can be removed with easy, can dispense with overetch, that facilitates to prevent the loss of the field oxide film caused by the overetch as well as the damage to the active region.

Second, since the distance between floating gates can be made small below the minimum patterning dimension in the photolithography, an area of the floating gate in contact with the control gate can be made larger relatively, that enhances a coupling ratio between the control gate and the floating gate, which improves a self programming performance.

Third, the moderate side profiles of the floating gate prevent electric field concentration, that prevents current leakage during device operation, which can improve gate disturb characteristics occurred when a high voltage is applied to the control gate.

It will be apparent to those skilled in the art that various modifications and variations can be made in the semiconductor memory and a method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor memory, comprising the steps of:

(1) forming a field oxide film on a semiconductor substrate in one direction;

(2) depositing a material for forming floating gate on an entire surface, and forming and stacking a first and a second masking material layers;

(3) selectively patterning the first and second masking material layers, and forming masking sidewalls at sides thereof;

(4) using the first and second masking material layers and the masking sidewalls in conducting an isotropic etching for first time patterning of the material layer for forming a floating gate, to form a separation region in the first direction on the field oxide film;

(5) forming an interlayer insulating layer, and a control gate forming material layer on an entire surface in succession;

(6) selectively patterning the control gate forming material layer to form a control gate separated in a second direction;

(7) using the control gate in patterning the floating gate forming material layer for the second time, and processing impurity implanting for forming source/drain.

2. A method as claimed in claim 1, wherein the floating gate forming material layer, the second masking material layer, and the masking sidewalls are formed of an identical material.

3. A method as claimed in claim 2, wherein the floating gate forming material layer, the second masking material layer, and the masking sidewalls are formed of polysilicon.

4. A method as claimed in claim 1, wherein the first masking material layer is formed of an HLD oxide film.

5. A method as claimed in claim 1, wherein a distance between floating gate forming material layers patterned for the first time is smaller than a distance between the patterned first and second masking material layers before formation of the masking sidewalls.

6. A method as claimed in claim 1, wherein, in the step (4), edge portions of the floating gate forming material layer are formed to have moderate slopes.

7. A method as claimed in claim 1, further comprising the step of forming a tunneling oxide film on an active layer after the step (1).

8. A method as claimed in claim 1, wherein the floating gate forming material layer has a thickness identical to the second masking material layer.

9. A method as claimed in claim 1, wherein the interlayer insulating layer is formed by depositing an oxide film-a nitride film-an oxide film in succession.

10. A method as claimed in claim 1, further comprising the step of forming gate sidewalls for gate insulation at sides of the control gate and the floating gate before the step of processing impurity implanting in the step (7).

* * * * *